United States Patent [19]

Rumreich

[11] Patent Number: 5,086,474
[45] Date of Patent: Feb. 4, 1992

[54] AMPLIFIER HAVING MAXIMUM SUMMED POWER OUTPUT FROM A PLURALITY OF DEVICES HAVING LIMITED CURRENT SINKING CAPABILITY

[75] Inventor: Mark F. Rumreich, Indianapolis, Ind.
[73] Assignee: Thomson Consumer Electronics, Inc., Indianapolis, Ind.
[21] Appl. No.: 501,089
[22] Filed: Mar. 28, 1990
[51] Int. Cl.⁵ ............................................. H03F 21/00
[52] U.S. Cl. .................................... 381/120; 330/151
[58] Field of Search .......................... 358/198; 381/85; 330/151

[56] References Cited

U.S. PATENT DOCUMENTS

| | | | |
|---|---|---|---|
| 3,970,953 | 7/1976 | Walker et al. | 330/151 |
| 4,396,949 | 8/1983 | Meguro et al. | 358/198 |
| 4,517,602 | 5/1985 | Murphy, III et al. | 358/198 |
| 4,549,179 | 10/1985 | Stendardo | 381/85 |
| 4,739,280 | 4/1988 | Noro | 330/151 |

FOREIGN PATENT DOCUMENTS 55-66110 5/1980 Japan ................................... 330/151

OTHER PUBLICATIONS

Jung, Walter G., *IC Op-Amp Cookbook*, Howard W. Sams & Co., Inc., 1974, pp. 316-317.

*Primary Examiner*—Forester W. Isen
*Assistant Examiner*—Sylvia Chen
*Attorney, Agent, or Firm*—Joseph S. Tripoli; Peter M. Emanuel; Frederick A. Wein

[57] ABSTRACT

A first amplifier is configured for accepting a signal input and providing a drive signal to a load. A second amplifier is configured in a voltage follower configuration with an input derived from the output of the first amplifier. The output of the second amplifier is coupled in parallel with the first to the load. The output from the second amplifier is nearly an exact duplicate of the output from the first amplifier, and the output contributions from the two amplifiers are therefore substantially equal. Isolation resistors are provided in series with the load and the respective output terminals of the amplifiers for protecting the operational amplifiers from adverse loading conditions.

4 Claims, 1 Drawing Sheet

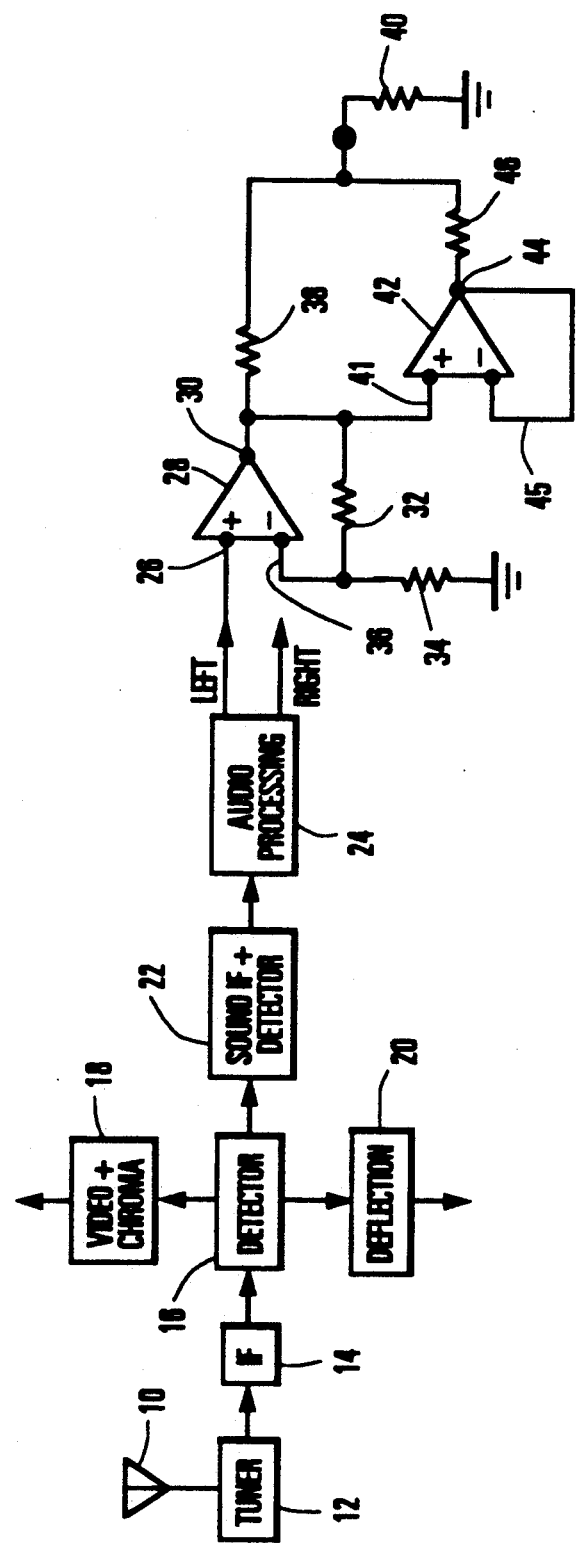

AMPLIFIER HAVING MAXIMUM SUMMED POWER OUTPUT FROM A PLURALITY OF DEVICES HAVING LIMITED CURRENT SINKING CAPABILITY

BACKGROUND

The present invention relates to amplifier circuits for driving a load, and more particularly, to amplifier circuits for achieving maximum power transfer from a plurality of devices each having limited current capability.

It is often necessary to achieve a power output from a circuit beyond the capability of particular devices within the circuit. This is often the case when, for economic reasons, the lower power devices are readily available at a reasonable cost and upgrading to higher power devices requires an increased cost factor that is unreasonable with respect to the achievable power gain.

Paralleling lower power devices will increase power output capability. However the plurality of lower power devices must be matched so as to evenly distribute the contribution from each of the devices, otherwise, at high power outputs, some of the devices will load the other devices instead of contributing to driving the load. Additionally, the devices have to track each other at lower power output in order to achieve simultaneous maximum peak power from the devices.

Thus, it is desirable when using a plurality of cooperating devices for increasing the power output into a load, that each of the devices be identical. Such a goal is easier to achieve when all of the plurality of devices are present on a same integrated circuit chip. In such a situation they are in close physical proximity to each other and are produced at the same time under identical processes. Operational amplifiers are particularly useful for such parallel load driving purposes since often four or more closely matched devices are available on a single integrated circuit chip at a minimal cost. However, even though the devices are close to being identical, each of the devices requires external components which have tolerances which greatly effect the tolerance of the complete amplifier circuit.

In the prior art, another common configuration for increasing the power output to a load is to use two low power output devices such as shown in National Semiconductor linear applications handbook note AN69-5. This applications note shows two operational amplifiers operating in a push-pull configuration with the amplifiers being fed with 180 degree out-of-phase signals. This configuration provides twice the voltage swing across the load for a given supply voltage thus increasing the power output capability by a factor of 4 over a single amplifier. This will work for high impedance loads but it is not satisfactory for low impedance loads where the output devices are current limited rather than voltage limited.

When the lower power devices are current limited, it is common to have a single device driving an external current amplifier in order to boost the power delivered to the load. In such a situation, an operational amplifier will often drive a pair of external NPN and PNP transistors connected between positive and negative supply voltages in what is called a "totem pole" configuration such as shown in National Semiconductor applications note 125 in FIG. 15 and note 127 in FIG. 7. However, as explained above, these external devices, aside from being discrete devices and therefore not necessarily closely matched, present an unreasonable increase in cost, especially if only a moderate increase in power output is required.

Another possible configuration includes two operational amplifiers with their non-inverting input terminals coupled in parallel with each other to a signal source and their outputs coupled in parallel to a load. Each of the operational amplifiers has a first feedback resistor coupled between the common output at the load and an inverting input, and a second feedback resistor coupled between the inverting input and signal ground. The gain of each amplifier is the ratio of the respective first and second feedback resistors. The outputs are coupled in parallel through isolation resistors so that the low output impedances of the amplifiers do not load each other. Such a configuration has the disadvantage that even if the two operational amplifiers are reasonably identical, e.g., because they are on the same integrated circuit chip, the tolerances of the gain determining feedback resistors and other external components must be taken into account. E.g., if the resistors are five percent tolerance resistors, which is commonly case for consumer products such as television receivers, the possible difference in the gain just between two amplifiers can be as great as ten percent. This means that one amplifier can clip substantially before the other. Since power is proportional to the square of the voltage applied to the load, this gain difference translates to a twenty percent difference in power delivered to the load. The resistance ratio differential can be reduced by using high tolerance components, e.g., one percent tolerance resistors. This may be an acceptable solution for instrumentation devices but presents an undesirable cost for consumer products in a highly competitive field such as television receivers.

Accordingly, it is desirable to achieve the maximum power output from a plurality of devices having relatively limited current sourcing capabilities in a cost effective manner.

SUMMARY OF THE INVENTION

Briefly, the present invention relates to an amplifier circuit directed to increasing the ability to sum power outputs of a plurality of relatively low power devices by reducing tolerances between the devices. A first amplifier is configured for accepting a signal input and providing a drive voltage to a load. A second amplifier is configured in a voltage follower configuration with an input derived from the output of the first amplifier, and has an output coupled to the load. The output from the second amplifier is a substantial duplicate of the output from the first amplifier and therefore the output contributions from the two amplifiers are nearly identical. In this way, tolerances between the respective amplifiers are reduced and each amplifier will contribute nearly its maximum current simultaneously with the other amplifier. Isolation resistors are provided in series with the load and the respective output terminals of the amplifiers for protecting the operational amplifiers from adverse loading conditions.

DESCRIPTION OF THE DRAWING

Reference may be had to the accompanying single FIGURE wherein there is shown, partially in block diagram form and partially in schematic form, pertinent portions of a television receiver having a power amplifier for driving an audio load constructed according to aspects of the present invention.

DETAILED DESCRIPTION OF THE PREFERRED EMBODIMENT

Referring now to the FIGURE, a television signal is received at a broadcast receiving antenna 10 or from another suitable source such as a cable system, VCR, or the like, is processed in tuner 12 where the desired signal is selected and converted to an IF frequency signal for processing by IF section 14. A composite video signal is derived from the IF signal by a detector 16 and is fed to video and chroma sections 18 and deflection processing sections 20. An intercarrier sound signal is processed and detected by sound IF and detector 22 to produce an audio signal which is in turn processed by audio processor 24. Audio processor 24 derives left and right stereophonic signals which are each amplified in order to drive a respective transducer such as a loudspeaker, headphone, or earphone. In the exemplary embodiment, only the left channel is shown. However, the right channel is identical, and therefore will not be further discussed.

In many television sets a headphone jack is provided for permitting private listening by viewers or, if desired, connection to an accessory such as a tape recorder. Head and earphones require substantially less power than loudspeakers but still require a substantial amount of drive power relative to a low power operational amplifier. Integrated circuits are extensively used in television receivers and operational amplifier integrated circuits are particularly useful for such purpose. However, the more economical integrated circuits do not, by themselves, have sufficient power to drive even a pair of headphones to a sufficient volume level. Since operational amplifier integrated circuits typically have four operational amplifiers on a chip, pairing amplifiers in parallel for each channel provides a desirable approach for driving relatively low power devices such as head and earphones. The drive circuit as discussed hereinafter is such an arrangement, and particularly is directed at overcoming the matching problems associated with external circuit components for the operational amplifiers as discussed hereinabove. The drive circuit is also directed to achieving maximum drive output consistent with low harmonic and intermodulation distortion levels.

Specifically, the input signal is fed to a non-inverting input terminal 26 of an operational amplifier 28. The output at terminal 30 is fedback by divider resistors 32 and 34 to an inverting input terminal 36. In a conventional arrangement the output from terminal 30 is merely coupled through an isolation resistor 38 to an acoustic transducer such as a headphone, which is represented by load resistor 40. The television receiver manufacturer has no control over which earphones or headphones the user may use. Load 40 can be any commonly available headphone or earphone which can have, e.g., an 8 ohm, 32 or 250 ohm impedance. For a high impedance load such as 250 ohms, the current sinking capability of a particular operational amplifier 28 used as an operational amplifier is usually sufficient. However, operational amplifier 28 may not have sufficient current sourcing and sinking capability to drive a low impedance load. Therefore, it is desirable to provide the current sourcing and sinking capability to provide sufficient loudness. This difficulty is overcome by the addition of operational amplifier 42 in the circuit configuration as shown.

Operational amplifier 42 is identical to operational amplifier 28 which is disposed on the same chip. The output signal from terminal 30 is fed to non-inverting input terminal 41 of operational amplifier 42 and the output signal at terminal 44 is fed back to inverting input 46 in a unity gain configuration. An output terminal 44 of operational ampifier 42 is coupled through a resistor 46 to load 40.

In this arrangement, with operational amplifier 42 having unity voltage gain, the output at terminal 44 precisely follows the signal voltage present at 30. In other words, operational amplifier 42 is a voltage follower with an output voltage signal at terminal 44 which exactly tracks the output voltage at terminal 30. This has a substantial advantage over the traditional approach of having matched feedback resistors for each of the two operational amplifiers. In the present circuit, such tolerance problems between the circuits are avoided. Thus, the feedback resistors 32 and 34 effectively serve as the gain determining feedback resistors for both of the operational amplifiers 28 and 42, and the current contribution from operational amplifier 42 is substantially equal to the current contribution from operational amplifier 28 thus resulting in the maximum power transfer at relatively low distortion.

Isolation resistors 46 and 38 are each in series with load 40 and preferably are matched resistors. The isolation resistors 46 and 38 are in series with load 40 and respective output terminals 44 and 30 and protect the operational amplifiers from loading each other as well as protecting the operational amplifiers from adverse loading conditions, such as a short circuit.

The present arrangement is applicable to any plurality of amplifiers with the nth amplifier deriving its input from the output of the first amplifier 28 amplifier. In this way, tolerance problems in circuits of the respective amplifiers are avoided and each amplifier will contribute its maximum current sinking capability simultaneously with the other amplifiers.

In the exemplary embodiment, operational amplifiers 28 and 42 are each one fourth of an LM 324 operational amplifier chip manufactured by National Semiconductor Corporation, resistors 32 and 34 are 68K and 10K respectively, and isolation resistors 38 and 46 are each 82 ohms, thus providing an output impedance to load 40 of 41 ohms.

What is claimed is:

1. An amplifier comprising:
   a first operational amplifier having a first non-inverting input terminal coupled to receive an input signal, a first output terminal, and a first inverting input terminal coupled to the first output terminal through a resistive voltage divider of a first and a second resistors providing negative feedback between the first inverting input terminal and the first output terminal without any intervening elements,
   a second operational amplifier having a second non-inverting input terminal coupled to said first output terminal, a second output terminal, and a second inverting input coupled to said second output in a unity gain configuration, and
   third and fourth resistors coupled between respective output terminals of said first and second operational amplifiers and a common load, said third and fourth resistors being exclusive of the resistive voltage divider.

2. The amplifier recited in claim 1 wherein said input signal is an audio signal and said common load point is adapted to receive one of a headphone and an earphone.

3. An amplifier comprising:
- a first operational amplifier having a first non-inverting input terminal coupled to receive an input signal, a first output terminal, and a first inverting input terminal coupled to the first output terminal through a resistive voltage divider of a first and a second resistors providing negative feedback between the first inverting input terminal and the first output terminal without any intervening elements,
- a second operational amplifier having a second non-inverting input terminal coupled to said first output terminal, a second output terminal, and a second inverting input coupled to said second output in a unity gain configuration, and
- third and fourth resistors coupled between respective output terminals of said first and second operational amplifiers and a common load so that the signals at the first and second output terminals are each coupled to the common load, said third and fourth resistors being exclusive of the resistive voltage divider.

4. The amplifier of claim 3 wherein said input signal is an audio signal and said common load is adapted to receive one of a headphone and an earphone.

* * * * *